United States Patent [19]

Ilardi et al.

[11] Patent Number: 5,498,293
[45] Date of Patent: Mar. 12, 1996

[54] CLEANING WAFER SUBSTRATES OF METAL CONTAMINATION WHILE MAINTAINING WAFER SMOOTHNESS

[75] Inventors: Joseph M. Ilardi, Sparta; George Schwartzkopf, Franklin Township, both of N.J.

[73] Assignee: Mallinckrodt Baker, Inc., Phillipsburg, N.J.

[21] Appl. No.: 264,858

[22] Filed: Jun. 23, 1994

[51] Int. Cl.⁶ ..................................................... C23G 1/02
[52] U.S. Cl. ..................................................... 134/3; 134/2
[58] Field of Search ........................... 134/1, 2, 3, 42, 134/38

[56] References Cited

U.S. PATENT DOCUMENTS

| | | | |
|---|---|---|---|
| 4,113,551 | 9/1978 | Bassous et al. | 156/662 |
| 4,239,661 | 12/1980 | Muraoka et al. | 252/541 |
| 4,339,340 | 7/1982 | Muraoka et al. | 252/79.5 |
| 4,964,919 | 10/1990 | Payne | 134/2 |
| 5,207,866 | 5/1993 | Lue et al. | 156/647 |
| 5,259,888 | 11/1993 | McCoy | 134/2 |

FOREIGN PATENT DOCUMENTS

| | | |
|---|---|---|
| 496605 | 7/1992 | European Pat. Off. |
| 540261 | 5/1993 | European Pat. Off. |
| 578507 | 1/1994 | European Pat. Off. |
| 59-109599 | 6/1984 | Japan . |
| 63-114132 | 5/1988 | Japan . |
| 64-014924 | 1/1989 | Japan . |
| 3-93229 | 4/1991 | Japan . |
| 5-259066 | 10/1993 | Japan . |

OTHER PUBLICATIONS

J. M. Grant et al., SPIE vol. 2091, pp. 51–62 (Dec. 1993).
J. J. Kim et al., Electrochemical Society Proceedings, vol. 92-21, pp. 408–415 (Dec. 1992).
S. D. Hossain et al., J. Electrochem. Soc. vol. 140, pp. 3604–3606, Dec. 1993.
W. Kern, RCA Review, pp. 187–206, Jun. 1970.
W. Kern, RCA Review, pp. 207–233, Jun. 1970.

*Primary Examiner*—Scott Kastler
*Attorney, Agent, or Firm*—George W. Rauchfuss, Jr.; Parmelee, Bollinger & Bramblett

[57] ABSTRACT

Process for cleaning wafer substrates of metal contamination while maintaining wafer smoothness by contacting the wafer substrates with a cleaning composition comprising an aqueous, metal ion-free base and an amphoteric surfactant and optionally a metal complexing agent and a propylene glycol ether organic solvent.

18 Claims, No Drawings

CLEANING WAFER SUBSTRATES OF METAL CONTAMINATION WHILE MAINTAINING WAFER SMOOTHNESS

FIELD OF THE INVENTION

This invention relates to hydrogen peroxide-free cleaners for use in the microelectronics industry for cleaning integrated circuit substrates, more particularly for cleaning wafers and vias, of metal contamination while maintaining wafer surface smoothness. By the process of this invention, cleaners free of hydrogen peroxide can clean such wafer surfaces without undue etching thereof and without requiring further reagents such as HF to remove oxides from the wafer surfaces.

BACKGROUND OF THE INVENTION

The cleaning of integrated circuit (IC) substrates, such as silicon wafers, with metal-free alkaline solutions to remove organic and metal contamination is widely practiced. One commonly used alkaline solution of this type is known as SC-1 or RCA-1 and comprises a hot aqueous mixture of ammonium hydroxide, hydrogen peroxide, and water (1:1:5 of 30% $H_2O_2$, 28% $NH_4OH$ and $H_2O$) to remove organic impurities and copper contamination from a wafer surface. Various cleaning tasks can be accomplished with SC-1, among these, the cleaning of silicon wafers immediately after their fabrication, the cleaning of such wafers immediately prior to gate oxide growth, the removal of oxide etch residues later in the IC processing sequence, and selective etching and resist particulate removal.

Treatment of the wafer surfaces with the hot SC-1 or RCA-1 solution is generally followed by a hot acid solution known as SC-2 or RCA-2 to remove metals untouched by the SC-1 or RCA-1 solution. This hot acid solution SC-2 comprises hydrogen peroxide, hydrochloric acid and water (1:1:5 of 30% $H_2O_2$, 37% HCl and $H_2O$).

Both solutions, SC-1 and SC-2 contain hydrogen peroxide. The purpose of the hydrogen peroxide is to protect the silicon metal from exposure to strong acids or bases by continuously forming a protective oxide layer in order to prevent etching or roughening of the silicon surface.

It is, however, necessary for the wafer surfaces to be oxide-free to be suitable for further processing where an oxide surface is not wanted. Usually, it is then necessary to remove the protective oxide layer formed by the hydrogen peroxide in the cleaning solutions. As an example of a material commonly used to remove such protective oxide layer, there may be mentioned HF.

The presence of hydrogen peroxide in the formulations imparts an inherent instability to these solutions. Such solutions typically exhibit peroxide half-lives of less than one hour at 70° C. The hydrogen peroxide in the SC-1 solution in the presence of certain metals, particularly copper and iron, becomes unstable and decomposes in rapid exothermic fashion leading to potentially dangerous conditions. The hydrogen peroxide has a low tolerance for metal contamination. Additionally, the decomposed hydrogen peroxide drops the concentration of the hydrogen peroxide leading to the possibility of silicon etching producing wafers that are not acceptable for IC manufacture. Thus, the decomposed hydrogen peroxide needs to be replenished and this changes the solution composition thereby varying the cleaning properties of the solution. In addition, the inherently high pH of the hydrogen peroxide solution presents undesirable safety and environmental concerns.

Since the introduction of the SC-1 or RCA-1 solution, there have been proposals for using basic materials other than ammonium hydroxide to clean wafer surfaces. For example, quaternary ammonium hydroxide compounds, such as tetramethylammonium hydroxide (TMAH) or trimethyl-2-hydroxyethyl ammonium hydroxide (choline) have been reported in Japanese Patent Publications No. 3-93229 and 63-114132; U.S. Pat. Nos. 4,239,661; 4,964,919 and 5,259,888 and European Patent Publication No. 496605, for example. It is to be noted that the wafer roughness values mentioned in U.S. Pat. No. 4,964,919 are unacceptable for high density integrated circuit manufacture. Moreover, U.S. Pat. No. 5,207,866 describes a case where a quaternary amine without hydrogen peroxide present is used to anisotropically etch the silicon 100 face of wafers.

Without hydrogen peroxide present, none of the above mentioned alkaline or quaternary ammonium hydroxide-based cleaners can produce the acceptable roughness levels achieved by the present invention and necessary for high density integrated circuit manufacture.

It is an object of this invention to provide a cleaning solution for cleaning wafer substrates of metal contamination without increasing surface microroughness which cleaner composition does not require the use of hydrogen peroxide to provide a protective oxide layer. A further object of this invention is to provide a cleaner composition for cleaning wafer substrates of metal contamination without increasing surface microroughness and leaving an oxide-free wafer surface making the surface suitable for further processing where an oxide surface is not wanted. A still further object of this invention is to clean such wafer surfaces of metal contamination without requiring an acid treatment step or the use of materials, such as HF, used to remove oxide surfaces. An additional aspect of this invention is to provide a process for cleaning such wafer surfaces of metal contamination without increasing wafer surface microroughness by using only a single cleaning solution. Yet another object of this invention is to provide a process and composition for cleaning such wafer surfaces of metal contamination without increasing wafer surface microroughness using an aqueous alkaline solution, and more particularly, using an aqueous quaternary ammonium hydroxide solution free of hydrogen peroxide or other oxidizing agents. An even still further object of this invention is to provide such a process and composition for cleaning vias in processed wafers of resist and etching residue, particularly metal contamination. Yet another object of this invention is to provide such a process and alkaline cleaning composition for cleaning wafers and producing a roughness of less than about 25 Angstrom as the average distance in the Z direction between wafer peak heights and valleys.

BRIEF SUMMARY OF THE INVENTION

A process for cleaning microelectronic wafer surfaces in order to remove metal contamination without increasing surface microroughness, using hydrogen peroxide-free cleaning solutions comprising an aqueous, alkaline metal ion-free base and an amphoteric surfactant, comprises contacting the wafer surface with the cleaning solution for a time and at a temperature sufficient to clean the wafer surface. The cleaning compositions optionally contain a metal complexing agent and/or organic solvent. It has been discovered that such hydrogen peroxide-free aqueous alkaline cleaning compositions produce effective wafer cleaning action against metal contamination without producing undesirable wafer roughness. As the data in the following examples demonstrates, cleaner compositions containing only the alkaline base alone are unable to produce effective cleaning action as well as not producing undue wafer surface roughness, i.e. a Z-range roughness of 25 Angstroms or less.

DETAILED DESCRIPTION OF THE INVENTION

The aqueous, alkaline cleaning compositions used in the process of this invention generally comprise an alkaline component in an amount of up to about 25% by weight, generally from about 0.05 to about 10% by weight, and an amphoteric surfactant in an amount of up to about 10% by weight, generally from about 0.001 to about 10% by weight, and preferably about 0.01 to about 5% by weight of the total cleaner composition. The remaining balance of the cleaner composition being made up of water, preferably high purity deionized water. Optionally, the alkaline cleaning compositions used in this invention may contain up to about 2% by weight of a metal complexing agent and/or up to about 5% by weight of an organic solvent.

Any suitable alkaline component may be used in the cleaner compositions of this invention. The alkaline components of these cleaners are preferably quaternary ammonium hydroxides, such as tetraalkyl ammonium hydroxides (including hydroxy- and alkoxy-containing alkyl groups generally of from 1 to 4 carbon atoms in the alkyl or alkoxy group). The most preferable of these alkaline materials are tetramethyl ammonium hydroxide and trimethyl-2-hydroxyethyl ammonium hydroxide (choline). Examples of other usable quaternary ammonium hydroxides include: trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethylethyl-2-hydroxyethyl ammonium hydroxide, dimethyldi(2-hydroxyethyl) ammonium hydroxide, monomethyltri(2-hydroxyethyl) ammonium hydroxide, tetraethyl ammonium hydroxide, tetrapropyl ammonium hydroxide, tetrabutyl ammonium hydroxide, monomethyltriethyl ammonium hydroxide, monomethyltripopyl ammonium hydroxide, monomethyltributyl ammonium hydroxide, monoethyltrimethyl ammonium hydroxide, monoethyltributyl ammonium hydroxide, dimethyldiethyl ammonium hydroxide, dimethyldibutyl ammonium hydroxide, and the like and mixtures thereof.

Other alkaline components are also operable including, for example, ammonium hydroxide, organic amines particularly alkanolamines such as 2-aminoethanol, 1-amino-2-propanol, 1-amino-3-propanol, 2-(2-aminoethoxy)ethanol, 2-(2-aminoethylamino)ethanol, 2-(2-aminoethylamino)ethylamine and the like, and other strong organic bases such as guanidine. Alkaline solutions containing metal ions such as sodium or potassium may also be operative. Mixtures of these additional alkaline components, particularly ammonium hydroxide, with the aforementioned tetraalkyl ammonium hydroxides are also useful and are generally preferred.

The aqueous alkaline cleaner compositions of this invention contains any suitable amphoteric surfactant. Among the various amphoteric surfactants useful in the cleaner compositions of this invention, there may be mentioned, for example, betaines and sulfobetaines such as alkyl betaines, amidoalkyl betaines, alkyl sulfobetaines and amidoalkyl sulfobetaines; aminocarboxylic acid derivatives such as amphoglycinates, amphopropionates, amphodiglycinates, and amphodipropionates; iminodiacids such as alkoxyalkyl iminodiacids or alkoxyalkyl iminodiacids; amine oxides such as alkyl amine oxides and alkylamido alkylamine oxides; fluoroalkyl sulfonates and fluorinated alkyl amphoterics; and mixtures thereof.

As examples of amphoteric surfactants useful in the cleaner compositions of this invention, there may be mentioned, for example: betaines and sulfobetaines of the formula

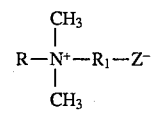

wherein R is alkyl or

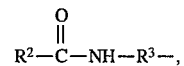

$Z^-$ is $COO^-$ or $SO_3^-$, $R^1$ is alkyl or hydroalkyl, $R^2$ is alkyl of up to about 20 carbon atoms, preferably about 12 to about 15 carbon atoms, and $R^3$ is alkyl; amphoglycinates and amphopropionates of the formula

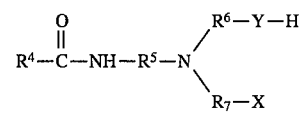

wherein $R^4$ is alkyl of up to about 20 carbon atoms, preferably about 6 to about 15 carbon atoms, and $R^5$, $R^6$, and $R^7$ are each individually alkyl, Y is O or COO and X is COOH or $O-R^8-COOH$ wherein $R^8$ is alkyl; iminodiacids of the formula

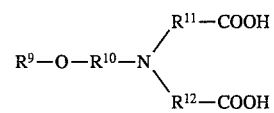

wherein $R^9$ is alkyl of up to about 20 carbon atoms, preferably about 10 to about 15 carbon atoms, and $R^{10}$, $R^{11}$ and $R^{12}$ are each individually alkyl; amine oxides of the formula

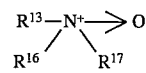

wherein $R^{13}$ is alkyl or $R^{14}$

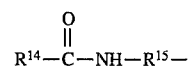

wherein $R^{13}$ is alkyl of up to about 20 carbon atoms, preferably about 12 to about 15 carbon atoms and $R^{15}$, $R^{16}$ and $R^{17}$ are each individually alkyl; and fluoroalkylsulfonates and fluorinated alkyl amphoterics. In the above mentioned amphoteric compounds alkyl, if not otherwise defined will preferably generally be lower alkyl of from 1 to 4 carbon atoms.

As examples of such amphoteric surfactants useful in the cleaner compositions of this invention, there may be mentioned, for example, cocoamidopropyl betaine, cocoamidopropyl dimethyl betaine, cocoamidopropyl hydroxy sultaine, capryloamphodipropionate, cocoamidodipropionate, cocoamphopropionate, cocoamphohydroxyethyl propionate, isodecyloxypropylimino dipropionic acid, laurylimino dipropionate, cocoamidopropylamine oxide and cocoamine oxide and fluorinated alkyl amphoterics such as Fluorad FC-100 of 3M Specialty Chemicals.

The cleaning solutions of this invention can be used as is or formulated with additional components such as any suitable metal chelating agents to increase the capacity of the formulation to retain metals in solution. Typical examples of chelating agents for this purpose are the following organic acids and their salts: ethylenediaminetetraacetic acid (EDTA), butylenediaminetetraacetic acid, cyclohexane-1,2-diaminetetra-acetic acid, diethylenetriaminepentaacetic acid, ethylenediaminetetrapropionic acid, (hydroxyethyl)ethylenediaminetriacetic acid (HEDTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, 8-hydroxyquinoline, N,N,N',N'-ethylenediaminetetra(methylenephosphonic) acid, and the like.

Also, the addition of a propylene glycol ether organic solvent, particularly a propylene glycol monoalkyl ether such as n-butoxypropanol, is also beneficial to enhance detergency and increase the metal holding capacity of the cleaner composition. A preferred formulation will contain both a propylene glycol monoalkyl ether organic solvent and a metal chelating agent, preferably ethylenediaminetetraacetic acid and n-butoxypropanol.

In the cleaner compositions used in the process of this invention, the alkaline component will generally be present in an amount of up to about 25% by weight of the composition, generally in an amount of from about 0.05 to about 10% by weight, and preferably in an amount of from about 0.1 to about 5% by weight. The amphoteric surfactant will generally be present in an amount of up to about 10% by weight, generally in an amount of from about 0.001 to about 10% by weight, and preferably in an amount of from about 0.01 to about 5% and more preferably in an amount of from about 0.1 to about 1% by weight.

If a metal chelating compound is included in the cleaner compositions, the metal chelating agent may be present in an amount up to about 5%, generally in an amount of from about 0.05 to about 5% and preferably in an amount of from about 0.5% to about 2% by weight. Similarly, if a propylene glycol ether organic solvent is employed in a cleaner composition of this invention, it may be present in an amount up to about 5%, generally in an amount of from about 0.05 to about 5% and preferably in an amount of from about 0.5 to about 2% by weight. The remaining balance of the cleaner composition being made up of water, preferably high purity deionized water.

As an example of a preferred cleaning composition of this invention, there may be mentioned, for example, an aqueous solution containing 0.08% by weight tetramethylammonium hydroxide (TMAH), 0.2% by weight ammonium hydroxide, 0.08% by weight cocoamphohydroxyethylpropionate (0.2% Rewoteric AM KSF-40) surfactant of Sherex Chemical Company, 1.9% by weight n-butoxypropanol and 0.1% by weight ethylenediaminetetraacetic acid (EDTA).

The invention is illustrated, but not limited to the following examples. In the examples, the percentages are by weight unless specified otherwise. The examples illustrate the surprising and unexpected result of this invention in cleaning wafer surfaces and preventing microroughness without an oxidant such as hydrogen peroxide and in achieving low metal levels without an acid treatment step.

In the following examples, the cleaner compositions were all prepared in polyethylene or polytetrafluoroethylene containers. New 3" double-sided polished silicon wafers (P doped, <100> crystal face) were placed in cleaner solutions for ten minutes at the stated temperatures. After ten minutes in the cleaning solutions, the wafers were removed, rinsed in deionized water and analyzed. After treatment, the "$R_z$ roughness" (defined as the average distance in the Z direction between peak heights and valleys) was measured for each cleaner composition. Metal levels were determined using a combination of vapor phase deposition/inductively coupled plasma/mass spectral detection. Roughness measurements were made with either an atomic force microscope or a profilometer, such as a Tencor Alpha step 100.

In the examples, the concentration of amphoteric surfactant is the weight percent of the commercially available surfactant indicated in the following table.

The amphoteric surfactants employed in the following examples were the following:

| Trade Name | Chemical Description | Manufacturer |
| --- | --- | --- |
| Amphoterge KJ-2 | capryloamphodipropionate | Lonza, Inc. |
| Amphoterge K-2 | cocoamidodipropionate | Lonza, Inc. |
| Amphoterge K | cocoamphohydroxyethylpropionate | Lonza, Inc. |
| Barlox C | cocoamidopropylamine oxide | Lonza, Inc. |
| Barlox 12 | cocoaamine oxide | Lonza, Inc. |
| Lonzaine CO | cocoamidopropyl betaine | Lonza, Inc. |
| Fluorad FC-100 | fluorinated alkyl amphoteric mixture | 3 M Specialty Chemicals |
| Amphoteric SC | alkyl iminoacid | Exxon Chemical Co. |
| Alkali Surfactant NM | alkoxy alkyl iminoacid | Exxon Chemical Co. |
| Rewoteric AM CAS-15 | cocoamidopropyl hydroxy sultaine | Sherex Chemical Co. |
| Rewoteric AM LP | lauryliminodipropionate | Sherex Chemical Co. |
| Rewoteric AM 2CSF | cocoamphodipropionate | Sherex Chemical Co. |
| Rewoteric AM KSF-40 | cocoamphohydroxyethylpropionate | Sherex Chemical Co. |

EXAMPLE 1

Aqueous solutions of tetramethylammonium hydroxide (TMAH) with and without amphoteric surfactants were prepared. Wafers were placed in these solutions for 10 minutes at 50° C., removed, and rinsed with deionized water. After drying, the "$R_z$ roughness" was measured. The results, set forth in Table 1, clearly show the ability of amphoteric surfactants to prevent or moderate the roughening of silicon surfaces that accompanies exposure to alkaline solutions. All of the cleaning solutions listed below have pH>12.

TABLE 1

| Effect of Amphoteric Surfactants on TMAH Cleaners at 50° C. | | | | |
| --- | --- | --- | --- | --- |
| Comparative TMAH Solutions without Amphoteric Surfactant | | TMAH Formulation Containing Amphoteric Surfactant | | |
| Wt % TMAH | $R_z$ Roughness Å | Surfactant | Wt % | $R_z$ Roughness Å |
| 0.1 | 100 | Amphoterge KJ-2 | 0.004 | <25 |
| 1.0 | 350 | Amphoterge KJ-2 | 0.04 | <25 |

TABLE 1-continued

Effect of Amphoteric Surfactants on TMAH Cleaners at 50° C.

| Comparative TMAH Solutions without Amphoteric Surfactant | | TMAH Formulation Containing Amphoteric Surfactant | | |
|---|---|---|---|---|
| Wt % TMAH | $R_z$ Roughness Å | Surfactant | Wt % | $R_z$ Roughness Å |
| 10 | 1,500 | Amphoterge KJ-2 | 0.04 | 100 |
| 10 | 1,500 | Amphoterge KJ-2 | 0.4 | 30 |
| 10 | 1,500 | Amphoterge KJ-2 | 4 | 40 |
| 10 | 1,500 | Amphoterge KJ-2 | 10 | 200 |
| 0.5 | 275 | Amphoterge KJ-2 | 0.1 | <25 |
| 0.5 | 275 | Amphoterge K-2 | 0.1 | <25 |
| 0.5 | 275 | Amphoterge K | 0.1 | <25 |
| 0.5 | 275 | Lonzaine CO | 0.1 | <25 |
| 0.5 | 275 | Flourad FC-100 | 0.1 | <25 |
| 0.5 | 275 | Amphoteric SC | 0.1 | <25 |
| 0.5 | 275 | Alkali Surfactant NM | 0.1 | <25 |
| 0.5 | 275 | Rewoteric AM CAS-15 | 0.1 | <25 |
| 0.5 | 275 | Rewotewic AM LP | 0.1 | <25 |
| 0.5 | 275 | Rewoteric AM 2CSF | 0.1 | <25 |

EXAMPLE 2

The wafers for this example were treated in the same manner as Example 1 except that the cleaning temperature was 70° C. The results, set forth in Table 2, clearly show the capability of amphoteric surfactants to prevent or moderate the roughening of silicon surfaces that accompanies exposure to alkaline solutions. All of the solutions listed below have pH>12.

TABLE 2

Effect of Amphoteric Surfactants on TMAH Cleaners at 70° C.

| Comparative TMAH Solutions without Amphoteric Surfactant | | TMAH Formulation Containing Amphoteric Surfactant | | |
|---|---|---|---|---|
| wt % TMAH | $R_z$ Roughness Å | Surfactant | wt % | $R_z$ Roughness Å |
| 0.1 | 6,000 | Amphoterge KJ-2 | 0.004 | <25 |
| 1.0 | 8,500 | Amphoterge KJ-2 | 0.04 | <25 |
| 3.0 | 8,200 | Amphoterge KJ-2 | 0.4 | 50 |
| 5.0 | 3,000 | Amphoterge KJ-2 | 0.4 | 50 |
| 0.5 | 1,000 | Amphoterge K-2 | 0.1 | <25 |
| 0.5 | 1,000 | Barlox C | 0.1 | <25 |
| 0.5 | 1,000 | Barlox 12 | 0.1 | <25 |
| 0.5 | 1,000 | Rewoteric AM CAS-15 | 0.1 | <25 |
| 0.5 | 1,000 | Rewoteric AM KSF-40 | 0.1 | <25 |

EXAMPLE 3

Wafers for this example were treated in the same manner as Example 1 except that the cleaning temperature was 90° C. The results, set forth in Table 3, clearly show the capability of amphoteric surfactants to prevent or moderate the roughening of silicon surfaces that accompanies exposure to alkaline solutions. The solutions listed below have pH>12.

TABLE 3

Effect of Amphoteric Surfactants on TMAH Cleaners at 90° C.

| Comparative TMAH Solution without Amphoteric Surfactant | | TMAH Formulation Containing Amphoteric Surfactant | | |
|---|---|---|---|---|
| wt % TMAH | $R_z$ Roughness Å | Surfactant | wt % | $R_z$ Roughness Å |
| 0.5 | 28,000 | Barlox C | 0.1 | <25 |
| 0.5 | 28,000 | Barlox 12 | 0.1 | <25 |

EXAMPLE 4

The wafers for this example were treated in the same manner as Example 1 using a variety of alkaline cleaning components including: tetramethylammonium hydroxide (TMAH), tetraethylammonium hydroxide (TEAH), choline (2-hydroxyethyltrimethylammonium hydroxide), and ammonium hydroxide ($NH_4OH$). The results are set forth in Table 4 for alkaline component and surfactant concentrations of 0.5 and 0.1 weight percent respectively, with treatment conditions of 50° C. for ten minutes. Each of the four alkaline materials etched silicon if the amphoteric surfactant Amphoterge KJ-2 was omitted. When the amphoteric surfactant was present, however, there were no signs of etching for any of the treatments.

TABLE 4

| Alkaline Component 0.5% | Surfactant 0.1% | $R_z$ Roughness Å |
|---|---|---|
| TMAH | None | 275 |
| TMAH | Amphoterge KJ-2 | <25 |
| TEAH | None | 75 |
| TEAH | Amphoterge KJ-2 | <25 |
| Choline | None | 600 |
| Choline | Amphoterge KJ-2 | <25 |
| $NH_4OH$ | None | 300 |
| $NH_4OH$ | Amphoterge KJ-2 | <25 |

EXAMPLE 5

The results from this example show the excellent metal removal capabilities of a cleaner formulation of this invention when compared to conventional SC-1 containing one part 30% hydrogen peroxide, one part 28% ammonium hydroxide, and five parts water, all by volume. The cleaner composition of this invention (Formulation A) is composed of the following components: 97.4 wt. % water, 0.08 wt. % tetramethylammonium hydroxide, 1.9 wt. % n-butoxypropanol, 0.1 wt. % ethylenediaminetetraacetic acid, 0.2 wt. % ammonium hydroxide and 0.1 wt. % Rewoteric AM KSF-40 amphoteric surfactants.

Wafers were cleaned for 10 minutes at 70° C. Table 5 shows the effect of this treatment on residual metal contamination on the wafers which was measured using hydrogen fluoride vapor phase decomposition followed by inductively coupled plasma with mass spectral detection. Also contained in Table 5 are data for two runs in which the cleaners were purposely contaminated with high levels of Fe (100 ppb), Al (1,000 ppb) and Cu (1,000 ppb). The data in the table clearly shows the superior metal holding capacity of Formulation A even if it is highly contaminated by metals.

TABLE 5

| Wafer Treatment | × 10¹⁰ atoms/cm² | | |
| --- | --- | --- | --- |
| | Aluminum | Copper | Iron |
| None (as received) | 2,500 | <8 | 159 |
| Conventional SC-1 | 1,867 | <8 | 193 |
| Formulation A | <20 | <8 | 60 |
| Contaminated SC-1 | 15,300 | 2,100 | 1,600 |
| Contaminated Formulation A | 5,000 | <8 | 200 |

EXAMPLE 6

Cleaner composition Formulation A of Example 5 was used to clean three unused silicon wafers (<100> crystal face, polished on both sides, P doped) for 10 minutes at 70° C. Roughness measurements were made with an Atomic Force Microscope on the wafers before and after the cleaning step. The results in Table 6 shows the effectiveness of Formulation A in reducing microroughness on polished wafers. Two different roughness measurement parameters are shown for comparison $R_z$ as previously defined, and "mean roughness" ($R_a$) which is defined as the mean value of the surface relative to the center plane and is calculated using:

$$R_a = \frac{1}{L_y L_x} \int_1^{L_y} \int_1^{L_x} |f(x, y)| dx dy$$

where $f(x,y)$ is the surface relative to the center plane and $L_x$ and $L_y$ are the dimensions of the surface in two dimensions.

TABLE 6

| Wafer | $R_z$ Roughness (nm) | Mean Roughness (Ra) (nm) |
| --- | --- | --- |
| #1 (as received) | 13.82 | 0.993 |
| #1 cleaned in Formulation A | 2.23 | 0.227 |
| #2 (as received) | 61.81 | 2.89 |
| #2 cleaned in Formulation A | 4.42 | 0.511 |
| #3 (as received) | 2.38 | 0.188 |
| #3 cleaned in Formulation A | 2.12 | 0.172 |

EXAMPLE 7

Flamed 57 mm. silicon wafers were used which were stored in sealed quartz petri dishes to avoid organic contamination. These wafers were cleaned as in Example 4 and analyzed for organic contamination using plasma chromatography coupled with mass spectroscopy (PC/MS). This technique involves heating to volatilize any adhering organic materials. The volatilized molecules are ionized and separated into fractions by passing them through a potential gradient. The high sensitivity of PC/MS allows detection of one part of organic material in 10¹³ parts of a matrix.

The "untreated" wafer was simply rinsed in deionized water for ten minutes at room temperature. Its PC/MS spectrum showed two ion mass peaks (293 and 337 mass units) which are due to the environmentally ubiquitous phthalate esters, common plasticizers used in laboratory equipment. A wafer cleaned as in Example 4 using SC-1, gave a spectrum that had six new unidentified peaks (300, 335, 371, 411, 436 and 533 mass units) indicative of more organic contamination than the untreated control. A wafer cleaned as in Example 4 using Formulation A, gave a spectrum showing three ion mass peaks (300, 335 and 374 mass units), i.e. less organic contamination than that indicated for SC-1. Thus the Formulation A cleaning procedure reduces residual volatile organic impurities on this wafer to less than the standard SC-1 treatment. This test shows that negligible residue was left by the organic components of Formulation A insuring that further IC processing can proceed without interference.

With the foregoing description of the invention, those skilled in the art will appreciate that modifications may be made to the invention without departing from the spirit thereof. Therefore, it is not intended that the scope of the invention be limited to the specific embodiments illustrated and described.

What is claimed is:

1. A process for cleaning a microelectronics wafer substrate surface to remove metal contamination and obtain an essentially oxide-free wafer surface while maintaining wafer smoothness without requiring an acid treatment step to remove oxides from the wafer substrate surface, said process comprising contacting the wafer substrate surface with an alkaline cleaning solution for a time and at a temperature sufficient to clean the wafer substrate surface, said cleaning composition comprising an aqueous, metal ion-free base and an amphoteric surfactant.

2. A process according to claim 1 wherein the alkaline cleaning solution comprises from about 0.05% to about 10% by weight metal ion-free base and from about 0.001% to about 10% by weight amphoteric surfactant.

3. A process according to claim 2 wherein the alkaline cleaning solution comprises from about 0.1% to about 5% by weight metal ion-free base and from about 0.01% to about 5% by weight amphoteric surfactant.

4. A process according to claim 2 wherein the metal ion-free base is selected from the group consisting of ammonium hydroxide, or a tetraalkyl ammonium hydroxide wherein the alkyl group is an unsubstituted alkyl group or an alkyl group substituted with a hydroxy or alkoxy radical, and mixtures thereof.

5. A process according to claim 4 wherein the metal ion-free base is selected from the group consisting of tetramethylammonium hydroxide, tetraethylammonium hydroxide, trimethyl-2-hydroxyethyl ammonium hydroxide, ammonium hydroxide, and mixtures thereof.

6. A process according to claim 1 wherein the metal ion-free base is an alkanolamine.

7. A process according to claim 1 wherein the metal ion-free base is a guanidine compound.

8. A process according to claim 1 wherein the amphoteric surfactant is selected from the group consisting of betaines, sulfobetaines, aminocarboxylic acid derivatives, iminodiacids, amine oxides, fluoroalkyl sulfonates, and fluorinated alkyl amphoterics, and mixtures thereof.

9. A process according to claim 4 wherein the amphoteric surfactant is selected from the group consisting of betaines, sulfobetaines, aminocarboxylic acid derivatives, iminodiacids, amine oxides, fluoroalkyl sulfonates, and fluorinated alkyl amphoterics, and mixtures thereof.

10. A process according to claim 4 wherein the amphoteric surfactant is selected from the group consisting of alkyl betaines, amidoalkyl betaines, alkyl sulfobetaines, amphoglycinates, amphopropionates, amphodiglycinates, amphodipropionates, alkoxyalkyl iminodiacids, alkoxyalkyl iminodiacids, alkyl amine oxides, alkylamido alkylamine oxides and fluorinated alkyl amphoterics.

11. A process according to claim 4 wherein the amphoteric surfactant is selected from the group consisting of cocoamidopropyl betaine, cocoamidopropyl dimethyl betaine, cocoamidopropyl hydroxy sultaine, capryloamphodipropionate, cocoamidodipropionate, cocoamphopropionate, cocoamphohydroxyethyl propionate, isodecyloxypropylimino dipropionic acid, laurylimino dipropionate, cocoamidopropylamine oxide and cocoamine oxide and fluorinated alkyl amphoterics.

12. A process according to claim 11 wherein the amphoteric surfactant is selected from capryloamphodipropionate and cocoamphohydroxyethyl propionate.

13. A process according to claim 1 wherein the alkaline cleaning solution additionally comprises a metal chelating compound in an amount up to about 5% by weight and a propylene glycol ether organic solvent in an amount up to about 5% by weight.

14. A process according to claim 4 wherein the alkaline cleaning solution additionally comprises a metal chelating compound in an amount up to about 5% by weight and a propylene glycol ether organic solvent in an amount up to about 5% by weight.

15. A process according to claim 9 wherein the alkaline cleaning solution additionally comprises a metal chelating compound in an amount up to about 5% by weight and a propylene glycol ether organic solvent in an amount up to about 5% by weight.

16. A process according to claim 11 wherein the alkaline cleaning solution additionally comprises a metal chelating compound in an amount up to about 5% by weight and a propylene glycol ether organic solvent in an amount up to about 5% by weight.

17. A process according to claim 12 wherein the alkaline cleaning solution additionally comprises a metal chelating compound in an amount up to about 5% by weight and a propylene glycol ether organic solvent in an amount up to about 5% by weight.

18. A process according to claim 15 wherein the metal ion-free base comprises ammonium hydroxide and tetraalkylammonium hydroxide, the amphoteric surfactant comprises cocoamphohydroxyethyl propionate, the metal chelating compound comprises ethylenediaminetetraacetic acid and the propylene glycol ether organic solvent comprises n-butoxypropanol.

* * * * *